United States Patent
Kimura et al.

(10) Patent No.: US 8,659,157 B2
(45) Date of Patent: Feb. 25, 2014

(54) ADHESIVE COMPOSITION FOR PRODUCING SEMICONDUCTOR DEVICE AND ADHESIVE SHEET FOR PRODUCING SEMICONDUCTOR DEVICE

(75) Inventors: Yuta Kimura, Ibaraki (JP); Yasushi Inoue, Ibaraki (JP); Takeshi Matsumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 79 days.

(21) Appl. No.: 13/477,349

(22) Filed: May 22, 2012

(65) Prior Publication Data

US 2012/0302042 A1    Nov. 29, 2012

(30) Foreign Application Priority Data

May 23, 2011 (JP) ................................. 2011-114938

(51) Int. Cl.
- *H01L 23/52* (2006.01)
- *H01L 23/48* (2006.01)
- *H01L 21/20* (2006.01)
- *H01L 23/31* (2006.01)

(52) U.S. Cl.
USPC ............. 257/753; 257/E21.122; 257/E23.127

(58) Field of Classification Search
USPC ........................... 257/753, E21.122, E23.127
See application file for complete search history.

(56) References Cited

U.S. PATENT DOCUMENTS

| 8,202,632 B2 * | 6/2012 | Kawakami et al. ........... 428/690 |
| 2008/0108723 A1 * | 5/2008 | Taniguchi et al. ............ 522/152 |
| 2009/0253916 A1 * | 10/2009 | Kawakami et al. ........... 548/446 |

FOREIGN PATENT DOCUMENTS

| JP | 2000-104040 | 4/2000 |
| JP | 2002-179769 | 6/2002 |
| JP | 2009-127042 | 6/2009 |
| JP | 2009-203338 | 9/2009 |
| JP | 2009-256630 | 11/2009 |
| JP | 2010-116453 | 5/2010 |

* cited by examiner

*Primary Examiner* — Luan C Thai

(74) *Attorney, Agent, or Firm* — Knobbe, Martens, Olson and Bear LLP

(57) ABSTRACT

An object of the present invention is to provide an adhesive composition that can form an adhesive sheet for producing a semiconductor device capable of suppressing deterioration in ion scavengeability after the adhesive sheet goes through thermal history. It is an adhesive composition for producing a semiconductor device containing at least an organic complex-forming compound that forms a complex with cations, and the 5% weight loss temperature of the organic complex-forming compound measured by thermogravimetry is 180° C. or more.

14 Claims, No Drawings

ADHESIVE COMPOSITION FOR PRODUCING SEMICONDUCTOR DEVICE AND ADHESIVE SHEET FOR PRODUCING SEMICONDUCTOR DEVICE

This application claims priority to Japanese Patent Application No. 2011-114938, filed May 23, 2011. The above-referenced application is hereby expressly incorporated by reference in its entirety.

BACKGROUND OF THE INVENTION

1. Field of the Invention

The present invention relates to an adhesive composition for producing a semiconductor device and an adhesive sheet for producing a semiconductor device.

2. Description of the Related Art

In recent years, stacked multi chip packages have been spread, wherein memory package chips for portable telephones or portable audio instruments are stacked into a multi-level. With progress in image processing technique or multi-functionalization of portable telephones and other instruments, an increase in the density and the integration degree of packages therefor has been promoted, as well as a decrease in the thickness thereof.

Meanwhile, when a cation (for example, a copper ion or iron ion) is mixed from the outside into a crystal substrate of a wafer in any process for semiconductor-production and then the cation reaches a circuit-forming area formed in the upper surface of the wafer, there is caused a problem that the electrical characteristic thereof is declined. When a semiconductor product is used, there is also caused a problem that a cation is generated from its circuit or wires so that the electrical characteristic is deteriorated.

Against the problems, the following attempts have been hitherto made: extrinsic gettering of working the rear surface of a wafer to form a fractured layer (strain), and capturing cations by the fractured layer so as to remove the cations (the gettering may be abbreviated to "EG" hereinafter); and intrinsic gettering of forming oxygen-precipitated defects in a crystal substrate of a wafer, and capturing cations by the oxygen-precipitated defects to remove the cations (the gettering may be abbreviated to "IG" hereinafter).

However, as the wafers have become thinner in recent years, advantageous effects of IG have been become smaller. Additionally, by removing strain in the rear surface of a wafer, which causes a crack or warp of the wafer, advantageous effects of EG come not to be gained. For these reasons, there has been a problem that sufficient advantageous effects of the getterings come not to be gained.

Hitherto, as a method for bonding semiconductor elements onto a substrate or the like, the following have been suggested: a method using a thermosetting paste resin (see, for example, JP 2002-179769 A); or a method using an adhesive sheet wherein a thermoplastic resin and a thermosetting resin are used together with each other (see, for example, JP 2000-104040 A).

An adhesive sheet containing an anion exchanger and captures chloride ions that cause corrosion of a wire to improve connection reliability, and the like have been conventionally proposed in, for example, Japanese Patent Application Laid-Open (JP-A) No. 2009-256630 (especially in claim 1 and paragraph 0044), JP-A No. 2009-127042 (especially in claim 1 and paragraph 0054), and JP-A No. 2010-116453 (especially in claim 1 and paragraph 0027). A pressure-sensitive adhesive sheet, in which anion scavenger for capturing chloride ions and the like is added to improve humidity and heat resistance when a voltage is applied, has been conventionally proposed as an adhesive sheet in JP-A No. 2009-203338 (especially claim 1 and paragraphs 0019 and 0050).

SUMMARY OF THE INVENTION

As a result of intensive examinations, the present inventors found that when an additive for capturing cations is added to an adhesive composition for producing a semiconductor device to capture cations mixed in from outside, deterioration in electrical characteristics of the semiconductor device to be manufactured is prevented, and product reliability can be improved. However, an adhesive sheet for producing a semiconductor device to be manufactured using the adhesive composition for producing a semiconductor device will go through steps involving thermal history, such as a die bonding step, a wire bonding step, a resin sealing step, and a reflow step when it is used for manufacturing a semiconductor device. Because of that, there has been room for improvement in order not to deteriorate the ion scavengeability even after the adhesive sheet goes through thermal history.

The present invention has been made in view of the above-described problems, and an object thereof is to provide an adhesive sheet for producing a semiconductor device capable of suppressing deterioration in ion scavengeability after the adhesive sheet goes through thermal history and an adhesive composition that can form the adhesive sheet for producing a semiconductor device.

The present inventors have made investigations on an adhesive composition for producing a semiconductor device and an adhesive sheet for producing a semiconductor device to solve the above-described conventional problems. As a result, it was found that an organic complex-forming compound having a 5% weight loss temperature measured by thermogravimetry of a certain temperature or more can be incorporated to obtain an adhesive sheet for producing a semiconductor device capable of suppressing deterioration in ion scavengeability after the adhesive sheet goes through thermal history, and the present invention was completed.

The adhesive composition for producing a semiconductor device according to the present invention contains at least an organic complex-forming compound that forms a complex with cations and has a 5% weight loss temperature of the organic complex-forming compound measured by thermogravimetry of 180° C. or more.

Because the adhesive composition contains at least an organic complex-forming compound that forms a complex with cations according to the above-described configuration, the adhesive sheet to be formed using the adhesive composition for producing a semiconductor device can capture cations mixed in from outside during various processes of manufacturing a semiconductor device. As a result, it becomes difficult for cations mixed in from outside to reach the surface on a wafer where a circuit is formed, deterioration in the electrical characteristics can be suppressed, and product reliability can be improved. An anion exchanger is added to the adhesive sheet and the like that have been proposed in JP-A Nos. 2009-256630, 2009-127042, and 2010-116453 to capture chloride ions that corrode copper wirings, and the documents have not disclosed that cations are captured. An ion scavenger for capturing chloride ions and the like is added in the pressure-sensitive adhesive sheet proposed in JP-A No. 2009-203338 to improve humidity and heat resistance when a voltage is applied, and the document has not disclosed that cations are captured.

Because the 5% weight loss temperature of the organic complex-forming compound measured by thermogravimetry is 180° C. or more, deterioration in the cation scavengeability due to thermal history can be suppressed. The adhesive composition contains an organic complex-forming compound instead of an inorganic complex-forming compound. Therefore, the generation of cracks and chipping of a wafer can be suppressed even if the organic complex-forming compound contacts the wafer when the adhesive sheet manufactured from the adhesive composition is pasted to the wafer.

In the above-described configuration, the organic complex-forming compound is preferably soluble in an organic solvent. When the organic complex-forming compound is soluble in an organic solvent, the compound can be easily and successfully dispersed in a resin.

In the above-described configuration, the organic complex-forming compound is preferably one or more compound(s) selected from the group consisting of a nitrogen-containing compound, a hydroxyl group-containing compound, and a carboxyl group-containing compound from the viewpoint that the cations can be more successfully captured.

In the above-described configuration, the nitrogen-containing compound is preferably one or more compound(s) selected from the group consisting of a triazole compound, a tetrazole compound, and a bipyridyl compound from the viewpoint that the cations can be more successfully captured.

In the above-described configuration, the hydroxyl group-containing compound is preferably one or more compound (s) selected from the group consisting of a quinol compound, a hydroxyanthraquinone compound, a polyphenol compound, and a higher alcohol from the viewpoint that the cations can be more successfully captured.

In the above-described configuration, the carboxyl group-containing compound is preferably one or more compound (s) selected from the group consisting of a carboxyl group-containing aromatic compound and a carboxyl-containing aliphatic compound from the viewpoint that the cations can be more successfully captured.

In the above-described configuration, the content of the additive is preferably in a range of 0.2 to 20 parts by weight to 100 parts by weight of the adhesive composition. By making the content 0.2 parts by weight or more, cations (especially copper ions) can be more effectively captured, and by making the content 20 parts by weight or less, a decrease in adhering strength can be suppressed.

In the above-described configuration, an epoxy resin is preferably contained. When an epoxy resin is contained, a high adhering strength can be obtained at a high temperature (for example, 175 to 260° C.). Therefore, an organic complex-forming compound and an epoxy resin are used together to obtain an adhesive sheet having a high adhering strength at a high temperature and is suppressed in deterioration in the electrical characteristics.

The adhesive sheet for producing a semiconductor device according to the present invention is formed from the adhesive composition described above. Because the adhesive composition contains at least an organic complex-forming compound that forms a complex with cations, the adhesive sheet formed using the adhesive composition can capture cations mixed in from outside during various processes of manufacturing a semiconductor device. As a result, it becomes difficult for cations mixed in from outside to reach the surface on a wafer where a circuit is formed, deterioration in the electrical characteristics can be suppressed, and product reliability can be improved. Because the 5% weight loss temperature of the organic complex-forming compound measured by thermogravimetry is 180° C. or more, deterioration in the cation scavengeability due to thermal history can be suppressed. The adhesive sheet contains an organic complex-forming compound instead of an inorganic complex-forming compound. Therefore, the generation of cracks and chipping of a wafer can be suppressed even if the organic complex-forming compound contacts the wafer when the adhesive sheet is pasted to the wafer.

In the above-described configuration, when 2.5 g of the adhesive sheet is soaked in 50 ml of an aqueous solution containing 10 ppm of copper ions, and the solution is left at 120° C. for 20 hours, the concentration of copper ions in the aqueous solution is preferably 0 to 9.9 ppm. When the concentration of copper ions in the aqueous solution after being left at 120° C. for 20 hours is 0 to 9.9 ppm, cations mixed in from outside during various processes of manufacturing a semiconductor device can be more easily captured. As a result, it becomes difficult for cations mixed in from outside to reach the surface on a wafer where a circuit is formed, deterioration in the electrical characteristics can be suppressed, and product reliability can be improved.

DESCRIPTION OF THE EMBODIMENTS

The adhesive composition for producing a semiconductor device of the present invention (hereinafter, also simply referred to as an "adhesive composition") contains at least an organic complex-forming compound that forms a complex with cations and has a 5% weight loss temperature of the organic complex-forming compound measured by thermogravimetry of 180° C. or more. The 5% weight loss temperature of the organic complex-forming compound measured by thermogravimetry is preferably 200° C. or more and more preferably 220° C. or more.

Because the adhesive composition contains at least an organic complex-forming compound that forms a complex with cations, the adhesive sheet to be formed using the adhesive composition for producing a semiconductor device can capture cations mixed in from outside during various processes of manufacturing a semiconductor device. As a result, it becomes difficult for cations mixed in from outside to reach the surface on a wafer where a circuit is formed, deterioration in the electrical characteristics can be suppressed, and product reliability can be improved. Because the 5% weight loss temperature of the organic complex-forming compound measured by thermogravimetry is 180° C. or more, deterioration in the cation scavengeability due to thermal history can be suppressed. The adhesive composition contains an organic complex-forming compound instead of an inorganic complex-forming compound. Therefore, the generation of cracks and chipping of a wafer can be suppressed even if the organic complex-forming compound contacts the wafer when the adhesive sheet manufactured from the adhesive composition is pasted to the wafer.

The organic complex-forming compound is preferably soluble in an organic solvent. When the organic complex-forming compound is soluble in an organic solvent, the compound can be easily and successfully dispersed in a resin. In the present invention, that the organic complex-forming compound is soluble in an organic solvent refers to a situation that 1 part by weight of the organic complex-forming compound can be dissolved in 100 parts by weight of methylethylketone as an organic solvent without being suspended.

In the present invention, the cations that form a complex with the organic complex-forming compound are not especially limited as long as they are cations. However, examples thereof include ions of Na, K, Ni, Cu, Cr, Co, Hf, Pt, Ca, Ba, Sr, Fe, Al, Ti, Zn, Mo, Mn, and V.

(Organic Complex-Forming Compound)

The organic complex-forming compound is not especially limited as long as it forms a complex with cations. However, it is preferably one or more compound (s) selected from the group consisting of a nitrogen-containing compound, a hydroxyl group-containing compound, and a carboxyl group-containing compound from the viewpoint that the cations can be successfully captured.

(Nitrogen-Containing Compound)

The nitrogen-containing compound is preferably in the form of a fine powder, a compound that is easily soluble in an organic solvent, or a liquid. Examples of the nitrogen-containing compound include a triazole compound, a tetrazole compound, and a bipyridyl compound from the viewpoint that the cations can be more successfully captured. However, a triazole compound is more preferable from the viewpoint of stability of a complex formed with copper ions. These can be used alone or two or more types can be used together.

The triazole compound is not particularly limited, and examples thereof include 1,2,3-benzotriazole, 1-{N,N-bis(2-ethylhexyl)aminomethyl}benzotriazole, carboxybenzotriazole, 2-{2'-hydroxy-5'-methylphenyl}benzotriazole, 2-{2'-hydroxy-3',5'-di-t-butylphenyl}-5-chlorobenzotriazole, 2-{2'-hydroxy-3'-t-butyl-5'-methylphenyl}-5-chlorobenzotriazole, 2-{2'-hydroxy-3',5'-di-t-amylphenyl}benzotriazole, 2-{2'-hydroxy-5'-t-octylphenyl}benzotriazole, 6-(2-benzotriazolyl)-4-t-octyl-6'-t-butyl-4'-methyl-2,2'-methylenebisphenol, 1-(2',3'-hydroxypropyl)benzotriazole, 1-(1',2'-dicarobxydiethyl)benzotriazole, 1-(2-ethylhexylaminomethyl)benzotriazole, 2,4-di-t-bentyl-6-{(H-benzotriazole-1-yl)methyl}phenol, 2-(2-hydroxy-5-t-butylphenyl)-2H-benzotriazole, 3-(2H-benzotriazole-2-yl)-5-(1,1-dimethylethyl)-4-hydroxy, octyl-3-[3-tert-butyl-4-hydroxy-5-(5-chloro-2H-benzotriazole-2-yl)phenyl]propionate, 2-ethylhexyl 3-[3-tert-butyl-4-hydroxy-5-(5-chloro-2H-benzotriazole-2-yl)phenylpropionate, 2-(2H-benzotriazole-2-yl)-6-(1-methyl-1-phenylethyl)-4-1,1,3,3-tetramethylbutyl)phenol, 2-(2H-benzotriazole-2-yl)-4-t-butylphenol, 2-(2'-hydroxy-5'-methylphenyl)benzotriazole, 2-(2'-hydroxy-5'-t-octylphenyl)-benzotriazole, 2-(3'-t-butyl-2'-hydroxy-5'-methylphenyl)-5-chlorobenzotriazole, 2-(2'-hydroxy-3',5'-di-t-amylphenyl)benzotriazole, 2-(2'-hydroxy-3',5'-di-t-butylphenyl)-5-chlorobenzotriazole, 2-[2'-hydroxy-3,5-di(1,1-dimethylbenzyl)phenyl]-2H-benzotriazole, 2,2'-methylenebis[6-(2H-benzotriazole-2-yl)-4-(1,1,3,3-tetramethylbutyl)phenol], (2-[2-hydroxy-3,5-bis(α,α-dimethylbenzyl)phenyl]-2H-benzotriazole, and methyl 3-(3-(2H-benzotriazole-2-yl)-5-t-butyl-4-hydroxyphenyl) propionate.

Commercially available product of the triazole compound may be used without especial limitation, and may be compounds manufactured by Johoku Chemical Co., Ltd., examples of trade names thereof including BT-120, BT-LX, CBT-1, JF-77, JF-78, JF-79, JF-80, JF83, JAST-500, BT-GL, BT-M, BT-260, BT-365, and TT-LX; products manufactured by BASF, examples of trade names thereof including TINUVIN PS, TINUVIN P, TINUVIN P FL, TINUVIN 99-2, TINUVIN 109, TINUVIN 900, TINUVIN 928, TINUVIN 234, TINUVIN 329, TINUVIN 329 FL, TINUVIN 326, TINUVIN 326 FL, TINUVIN 571, and TINUVIN 213; and products manufactured by Everlight Chemical Industrial Corp., examples of trade names thereof include EVESORB 81, EVESORB 109, EVESORB 70, EVESORB 71, EVESORB 72, EVESORB 73, EVESORB 74, EVESORB 75, EVESORB 76, EVESORB 78, and EVESORB 80. Triazole compounds are each used also as an antirust agent.

The tetrazole compound is not particularly limited, and may be, for example, 5-amino-1H-tetrazole.

The bipyridyl compound is not particularly limited, and may be, for example, 2,2'-bipyridyl, or 1,10-phenanthroline.

Hydroxyl-Containing Compound:

The hydroxyl-containing compound is not particularly limited, and is preferably a compound in a fine powdery form, a compound easily soluble in an organic solvent, or a compound in a liquid form. The hydroxyl-containing compound may be a quinol compound, a hydroxyanthraquinone compound, a polyphenolic compound, or a higher alcohol from the viewpoint of the attainment of more satisfactory cation-capturing. A polyphenolic compound is more preferred from the viewpoint of the stability of a complex with a copper ion. These compounds may be used alone or in combination of two or more thereof.

The quinol compound is not particularly limited, and may be, for example, 1,2-benzenediol.

The hydroxyanthraquinone compound is not particularly limited, and may be, for example, alizarin, or Anthrarufin.

The polyphenolic compound is not particularly limited, and may be, for example, tannin, and a tannin derivative (such as gallic acid, methyl gallate, and pyrogallol).

Examples of the higher alcohol include alcohols having a linear alkyl group or a branched alkyl group having 6 or more carbon atoms, especially 6 to 18 carbon atoms.

Carboxyl Group-Containing Compound:

The carboxyl group-containing compound is not particularly limited, and may be, for example, a carboxyl-containing aromatic compound and a carboxyl-containing aliphatic compound.

The carboxyl-containing aromatic compound is not particularly limited, and may be, for example, phthalic acid, picolinic acid and pyrrole-2-carboxylic acid.

The carboxyl-containing aliphatic compound is not particularly limited, and may be, for example, a higher aliphatic acid and a carboxylic acid chelating reagent.

Commercially available products of the carboxylic acid chelating reagent may be used without especial limitation. The products may be products manufactured by Chelest Corp., examples of trade names thereof including CHELEST A, CHELEST 110, CHELEST B, CHELEST 200, CHELEST C, CHELEST D, CHELEST 400, CHELEST 40, CHELEST OD, CHELEST NTA, CHELEST 700, CHELEST PA, CHELEST HA, CHELEST MZ-2, CHELEST MZ-4A, and CHELEST MZ-8.

The compounded amount of the organic complex-forming compound is preferably 0.2 to 20 parts by weight, more preferably 0.3 to 15 parts by weight, and further preferably 0.8 to 10 parts by weight to 100 parts by weight of the adhesive composition. The amount is especially preferably 1 part by weight or more. By making the amount 0.2 parts by weight or more, cations (especially copper ions) can be more effectively captured, and by making the amount 20 parts by weight or less, a decrease in adhering strength can be suppressed.

The adhesive composition preferably contains a thermoplastic resin. It is also preferred that the composition contains a thermoplastic resin and a thermosetting resin. Examples of the thermosetting resin include phenolic resin, amino resin, unsaturated polyester resin, epoxy resin, polyurethane resin, silicone resin, and thermosetting polyimide resin. These resins may be used alone or in combination of two or more thereof. It is particularly preferred to use at least either of epoxy resin or phenolic resin. Especially when an epoxy resin is used, a high adhering strength can be obtained at a high temperature (for example, 175 to 260° C.). Therefore, an organic complex-forming compound and an epoxy resin are used together to obtain an adhesive sheet having a high adhering strength at a high temperature and is suppressed in deterioration in the electrical characteristics.

The epoxy resin is not particularly limited as far as the resin is ordinarily used as an adhesive composition. Examples thereof include bisphenol A type, bisphenol F type, bisphenol S type, brominated bisphenol A type, hydrogenated bisphenol A type, bisphenol AF type, biphenyl type, naphthalene type, fluorene type, phenol novolak type, o-cresol novolak type, trishydroxyphenylmethane type, tetraphenylol ethane type, and other type bifunctional or polyfunctional epoxy resins; and hydantoin type, trisglycidylisocyanurate type and glycidylamine type epoxy resins. These may be used alone or in combination of two or more thereof. Of these epoxy resins, particularly preferred are novolak type, biphenyl type, trishydroxyphenylmethane type, and tetraphenylol ethane type epoxy resins since these resins are rich in reactivity with phenolic resin as a curing agent, and are excellent in heat resistance and other properties.

The phenolic resin is a resin acting as a curing agent for the epoxy resin. Examples thereof include phenol novolak resin, phenol aralkyl resin, cresol novolak resin, tert-butylphenol novolak resin, nonylphenol novolak resin, and others novolak type resins; resol type phenolic resins; and polyoxystyrenes such as polyparaoxystyrene. These may be used alone or in combination of two or more thereof. Of these phenolic resins, particularly preferred are phenol novolak resin and phenol aralkyl resin since the resins improve the connection reliability of a semiconductor device.

The blend ratio between the epoxy resin and the phenolic resin is preferable to set the amount of the hydroxyl groups in the phenolic resin appropriately into the range of 0.5 to 2.0 equivalents per equivalent of the epoxy groups in the epoxy resin component, more preferably into the range of 0.8 to 1.2 equivalents per equivalent thereof. In other words, if the blend ratio between the two is out of the range, a sufficient curing reaction does not proceed so that properties of the epoxy resin cured product are easily deteriorated.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

The content by percentage of the thermosetting resin is not particularly limited as far as the film made of the composition exhibits a function as a thermosetting film at the time of heating the film under predetermined conditions. The content by percentage is preferably from 5 to 60% by weight, more preferably from 10 to 50% by weight.

About the adhesive composition, it is preferred that the composition contains epoxy resin, phenolic resin and acrylic resin and the total amount of the epoxy resin and the phenolic resin is from 10 to 2000 parts by weight for 100 parts by weight of the acrylic resin. The amount is more preferably from 10 to 1500 parts by weight, even more preferably from 10 to 1000 parts by weight. When the total amount of the epoxy resin and the phenolic resin is set to 10 parts or more by weight for 100 parts by weight of the acrylic resin, the composition can gain a bonding effect when cured, so that peeling from the sheet made of the composition can be restrained. When the total amount is set to 2000 parts or less by weight, the following can be restrained: the sheet gets brittle so as to produce a low operability.

When the adhesive sheet formed by use of the adhesive composition is beforehand crosslinked into some degree, it is preferred to add, as a crosslinking agent, a polyfunctional compound reactive with functional groups or others at terminals of molecular chains of the polymer(s) to the composition. This manner makes it possible to improve the adhesive property at high temperatures and improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

A filler may be appropriately incorporated into the adhesive composition in accordance with the purpose of the composition. The incorporation of the filler makes it possible to give electroconductivity to the adhesive sheet obtained from the adhesive composition, improve the thermal conductivity thereof, adjust the elastic modulus. The filler may be an inorganic filler or an organic filler. The filler is preferably an inorganic filler from the viewpoint of an improvement in the handleability, an improvement in the thermal conductivity, the adjustment of the melt viscosity, the supply of thixotropy to the composition, and others. The inorganic filler is not particularly limited, and examples thereof include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and non-crystalline silica. These may be used alone or in combination of two or more thereof. From the viewpoint of an improvement in the thermal conductivity, preferred are aluminum oxide, aluminum nitride, boron nitride, crystalline silica, and non-crystalline silica. From the viewpoint of a good balance between the above-mentioned individual properties, preferred is crystalline silica or non-crystalline silica. In order to attain the supply of electroconductivity thereto, an improvement in the thermal conductivity, and others, an electroconductive material (electroconductive filler) may be used as the inorganic filler. The electroconductive filler includes metallic powder of silver, aluminum, gold, copper, nickel, electroconductive alloy in a spherical form, a needle form, or a flake form, a metal oxide such as alumina, amorphous carbon black, and graphite.

The average particle diameter of the filler may be set into the range of 0.005 to 10 μm. When the average particle diameter of the filler is set to 0.005 μm or more, the wettability of the adhesive composition to an adherend and the adhesive property of the adhesive composition can be better. When the average particle diameter is set to 10 μm or less, the advantageous effects of the filler added to produce the above-mentioned individual properties can be made sufficient and further the composition can keep heat resistance certainly. The average particle diameter of the filler is a value obtained by use of, for example, a light-intensity particle size distribution meter (instrument name: LA-910, manufactured by Horiba Ltd.).

Besides the cation-capturing additive, some other additive may be appropriately incorporated into the adhesive composition as the need arises. Examples of the other additive include an anion-capturing agent, a dispersing agent, an antioxidant, a silane coupling agent, and a curing promoter. These may be used alone or in combination of two or more thereof.

The method for producing the adhesive composition is not particularly limited, and may be yielded as a solution of the adhesive composition, for example, by charging the cation-capturing additive into a vessel, optionally charging a thermosetting resin, a thermoplastic resin and other additives thereinto, dissolving these components in an organic solvent, and stirring the components into an even state.

The organic solvent is not particularly limited as far as the solvent is a solvent wherein the components constituting the adhesive composition can be dissolved, mixed or dispersed into an even state and can be used solvents known in the prior art. Examples thereof include dimethylformamide, dimethylacetoamide, N-methylpyrrolidone, ketone solvents such as acetone, methyl ethyl ketone and cyclohexanone, toluene, and xylene. Methylethylketone, cyclohexanone or the like is preferred since these solvents are quickly dried, and can be inexpensively obtained. Among those, methylethylketone that can dissolve the organic complex-forming compound is more preferable.

The adhesive sheet for producing a semiconductor device according to the present embodiment (hereinafter, also simply referred to as an "adhesive sheet") can be produced as follows, for example. The adhesive sheet according to an embodiment of the invention is produced, for example, as follows: first, a solution of the adhesive composition is prepared; next, the adhesive composition solution is spread in a predetermined thickness onto a substrate separator to form a painted film; and then the painted film is dried under predetermined conditions. The substrate separator may be polyethylene terephthalate (PET), polyethylene or polypropylene; a plastic film or paper sheet that has a surface coated with a remover such as fluorine-contained remover or long-chain alkyl acrylate remover; or some other. The manner for the coating is not particularly limited, and may be, for example, roll coating, screen coating, and gravure coating. Condition for drying is, for example, as follows: the drying temperature is from 70 to 160° C. and the drying time is from 1 to 5 minutes. By this method, the adhesive sheet according to the embodiment is yielded.

Since the thus-yielded adhesive sheet contains the organic complex-forming compound, the sheet can capture a cation mixed from the outside in various processes in the production of a semiconductor device. As a result, the mixed cation does not easily reach a circuit-forming area formed on the upper surface of a wafer so that deterioration of the electrical property is restrained. Thus, the product reliability of the device can be improved.

The adhesive sheet for producing a semiconductor device is not particularly limited as far as the sheet is a sheet usable to produce a semiconductor device. Examples thereof include a die-bonding film for bonding a semiconductor chip onto an adherend such as a lead frame, a protective film for protecting the rear surface of a semiconductor chip of a flip chip type semiconductor device, and a sealing sheet used for sealing a semiconductor chip.

When 2.5 g of the adhesive sheet is soaked in 50 ml of an aqueous solution containing 10 ppm of copper ions, and the solution is left at 120° C. for 20 hours, the concentration of copper ions in the aqueous solution is preferably 0 to 9.9 ppm, more preferably 0 to 9.5 ppm, and further preferably 0 to 9 ppm. When 2.5 g of the adhesive sheet for producing a semiconductor device is soaked in 50 ml of an aqueous solution containing 10 ppm of copper ions, and the solution is left at 120° C. for 20 hours, and the concentration of copper ions in the aqueous solution is 0 to 9.9 ppm, cations mixed in from outside during various processes of manufacturing a semiconductor device can be more easily captured. As a result, it becomes difficult for cations mixed in from outside to reach the surface on a wafer where a circuit is formed, deterioration in the electrical characteristics can be suppressed, and product reliability can be improved.

When the adhesive sheet is thermally cured at 175° C. for 5 hours, left at 260° C. for 10 minutes, cut out to a weight of 2.5 g, soaked in 50 ml of an aqueous solution containing 10 ppm of copper ions, and left at 260° C. for 10 minutes, the concentration of copper ions in the aqueous solution is preferably 0 to 9.9 ppm, more preferably 0 to 9.5 ppm, and further preferably 0 to 9 ppm. When the adhesive sheet is thermally cured at 175° C. for 5 hours, left at 260° C. for 10 minutes, cut out to a weight of 2.5 g, soaked in 50 ml of an aqueous solution containing 10 ppm of copper ions, and left at 120° C. for 20 hours, if the concentration of copper ions in the aqueous solution is 0 to 9.9 ppm, deterioration in ion scavengeability after the adhesive sheet goes through thermal history can be further suppressed.

The shear adhering strength of the adhesive sheet to an adherend such as a wafer, a substrate, a circuit surface formed on a wafer, or a circuit surface formed on a substrate at 175° C. after the adhesive sheet is cured by heating at 175° C. for 1 hour is preferably 0.01 MPa or more and 100 MPa or less, more preferably 0.1 MPa or more and 80 MPa or less, and further preferably 0.2 MPa or more and 50 MPa or less. When the shear adhering strength of the adhesive sheet to an adherend at 175° C. after the adhesive sheet is cured by heating at 175° C. for 1 hour is 0.01 MPa or more and 100 MPa or less, a high adhering strength can be obtained at a high temperature.

About the adhesive sheet, it is preferred that the tensile storage modulus at 60° C. before the sheet is thermally cured is 0.01 MPa or more and 1000 MPa or less. The elasticity is more preferably 0.05 MPa or more and 100 MPa or less, even more preferably 0.1 MPa or more and 50 MPa or less. About the adhesive sheet, the tensile storage modulus at 260° C. after the sheet is thermally cured is 0.01 MPa or more and 500 MPa or less. The elasticity is more preferably 0.03 MPa or more and 500 MPa or less, even more preferably 0.05 MPa or more and 100 MPa or less, even more preferably 0.1 MPa or more and 50 MPa or less. When the tensile storage modulus at 60° C. before the thermal curing is 0.01 MPa or more, the sheet can maintain a shape required for a film and provide a good workability. When the tensile storage modulus at 60° C. before the thermal curing is 1000 MPa or less, the sheet can gain a good wettability to an adherend. Meanwhile, when the tensile storage modulus at 260° C. after the thermal curing is 500 MPa or less, the sheet makes it possible to relieve thermal stress generated by a difference in thermal expansion coefficient between a semiconductor chip and an interposer, which is a wiring board.

EXAMPLES

Below, preferred examples of the present invention are explained in detail. However, materials, addition amounts, and the like described in these examples are not intended to limit the scope of the present invention, and are only examples for explanation as long as there is no description of limitation in particular. Hereinafter, the word "part(s)" means part(s) by weight.

Example 1

The following (a) to (e) were dissolved in methylethylketone to obtain an adhesive composition solution having a concentration of 20% by weight.
(a) Acrylic ester polymer having ethyl acrylate-methyl methacrylate as a main component (SG-70L manufactured by Nagase ChemteX Corporation) 40 parts
(b) Epoxy resin (KI-3000 manufactured by Tohto Kasei Co., Ltd.) 5 parts
(c) Phenol resin (MEH-7851H manufactured by Meiwa Plastic Industries, Ltd.) 5 parts
(d) Silica filler (SO-E3 manufactured by Admatechs Co., Ltd.) 50 parts
(e) Organic complex-forming compound (a nitrogen-containing compound, TT-LX manufactured by Johoku Chemical Co., Ltd.) 0.3 parts Example 2

An adhesive composition solution according to Example 2 was obtained in the same way as in Example 1 except that the compounded amount of the organic complex-forming compound of (e) was changed to 0.5 parts in Example 2.

Example 3

An adhesive composition solution according to Example 3 was obtained in the same way as in Example 1 except that the compounded amount of the organic complex-forming compound of (e) was changed to 1 part in Example 3.

Example 4

An adhesive composition solution according to Example 4 was obtained in the same way as in Example 1 except that the compounded amount of the organic complex-forming compound of (e) was changed to 3 parts in Example 4.

Example 5

An adhesive composition solution according to Example 5 was obtained in the same way as in Example 1 except that the compounded amount of the organic complex-forming compound of (e) was changed to 10 parts in Example 5.

Example 6

An adhesive composition solution according to Example 6 was obtained in the same way as in Example 1 except that 3 parts of an organic complex-forming compound (a hydroxyl group-containing compound, dodecyl gallate, manufactured by Tokyo Chemical Industry Co., Ltd.) was used in Example 6 instead of the organic complex-forming compound (a nitrogen-containing compound, TT-LX manufactured by Johoku Chemical Co., Ltd.) of (e).

Example 7

An adhesive composition solution according to Example 7 was obtained in the same way as in Example 1 except that 5 parts of an organic complex-forming compound (a carboxyl-containing aliphatic compound, stearic acid, manufactured by Tokyo Chemical Industry Co., Ltd.) was used in Example 7 instead of the organic complex-forming compound (a nitrogen-containing compound, TT-LX manufactured by Johoku Chemical Co., Ltd.) of (e).

Example 8

The following (a) to (e) were dissolved in methylethylketone to obtain an adhesive composition solution having a concentration of 20% by weight.
(a) Acrylic ester polymer having ethyl acrylate-methyl methacrylate as a main component (SG-70L manufactured by Nagase ChemteX Corporation) 36 parts
(b) Epoxy resin (KI-3000 manufactured by Tohto Kasei Co., Ltd.) 4.5 parts
(c) Phenol resin (MEH-7851H manufactured by Meiwa Plastic Industries, Ltd.) 4.5 parts
(d) Silica filler (SO-E3 manufactured by Admatechs Co., Ltd.) 55 parts
(e) Organic complex-forming compound (a nitrogen-containing compound, TINUVIN928 manufactured by BASF Japan Ltd.) 3 parts Example 9

An adhesive composition solution according to Example 9 was obtained in the same way as in Example 8 except that the compounded amount of the organic complex-forming compound of (e) was changed to 5 parts in Example 9.

Example 10

An adhesive composition solution according to Example 10 was obtained in the same way as in Example 8 except that the compounded amount of the organic complex-forming compound of (e) was changed to 20 parts in Example 10.

Comparative Example 1

The following (a) to (d) were dissolved in methylethylketone to obtain an adhesive composition solution having a concentration of 20% by weight.
(a) Acrylic ester polymer having ethyl acrylate-methyl methacrylate as a main component (SG-70L manufactured by Nagase ChemteX Corporation) 36 parts
(b) Epoxy resin (KI-3000 manufactured by Tohto Kasei Co., Ltd.) 4.5 parts
(c) Phenol resin (MEH-7851H manufactured by Meiwa Plastic Industries, Ltd.) 4.5 parts
(d) Silica filler (SO-E3 manufactured by Admatechs Co., Ltd.) 55 parts Comparative Example 2

An adhesive composition solution according to Comparative Example 2 was obtained in the same way as in Comparative Example 1 except that 10 parts of an anion exchanger (IXE-550 manufactured by Toagosei Co., Ltd.) was further added to the adhesive composition of Comparative Example 1 in Comparative Example 2.

Comparative Example 3

An adhesive composition solution according to Comparative Example 3 was obtained in the same way as in Comparative Example 1 except that 3 parts of an organic complex-forming compound (a carboxyl group-containing compound, MZ-8 manufactured by Chelest Corporation) was further added to the adhesive composition of Comparative Example 1 in Comparative Example 3.
(Measurement of 5% Weight Loss Temperature Measured by Thermogravimetry (TG-DTA))

TG8120 manufactured by Rigaku Corporation was used to measure the 5% weight loss temperature according to thermogravimetry. 10 mg of an organic complex-forming compound that forms a complex with cations was placed in an aluminum container to measure the weight change of the sample in a temperature range of 25 to 550° C. at a temperature rise rate of 10° C./min under a nitrogen flow. The results are shown in Table 1.
(Evaluation of Solubility in Organic Solvent)

100 parts of methylethylketone, 1 part of an organic complex-forming compound, and rotors were place in a screw jar, the jar was lidded, and the contents were stirred for 1 hour using a stirrer to visually observe whether the contents were dissolved or not without being precipitated or suspended. The evaluation was made by marking a case where the contents were dissolved without being precipitated or suspended as ○ and a case where there were precipitates or suspended matters as x. The results are shown in Table 1.

TABLE 1

| Organic complex-forming compound | 5% Weight loss temperature | Solubility in organic solvent (Methylethylketone) |
| --- | --- | --- |
| TT-LX | 218° C. | ○ |
| Dodecyl gallate | 294° C. | ○ |
| Stearic acid | 223° C. | ○ |
| TINUVIN 928 | 293° C. | ○ |
| MZ-8 | 110° C. | x |

(Measurement of Concentration of Ionic Impurities in Adhesive Sheet Before Thermal Curing)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Each of the adhesive composition solutions according to Examples 2 to 10 and Comparative Examples 1 to 4 was applied onto a release-treated film in the same way as described above, and the solution was dried at 130° C. for 2 minutes to produce an adhesive sheet having a thickness of 20 μm. Each adhesive sheet (thickness 20 μm) was cut out into a size of 240 mm×300 mm (about 2.5 g), and it was folded in half 5 times to a size of 37.5 mm×60 mm. Then, the sheet was placed in a tightly closed cylindrical Teflon (tradename) container having a diameter of 58 mm and a height of 37 mm, and 50 ml of a 10 ppm aqueous copper (II) ion solution was added in the container. Then, the container was left in an isothermal dryer (PV-231 manufactured by ESPEC Corp.) of 120° C. for 20 hours. The film was taken out to measure the concentration of copper ions in the aqueous solution using ICP-AES (SPS-1700HVR manufactured by SII Nano Technology Inc.). The results are shown in Tables 2 and 3.
(Measurement of Concentration of Ionic Impurities in Adhesive Sheet after Thermal Curing)

The adhesive composition solution according to Example 1 was applied onto a release-treated film consisting of a polyethylene terephthalate film having a thickness of 50 μm having been subjected to a silicone release treatment, and the solution was dried at 130° C. for 2 minutes to produce an adhesive sheet having a thickness of 20 μm. Then, the solution was thermally cured at 175° C. for 5 hours and left at 260° C. for 10 minutes. Each of the adhesive composition solutions according to Examples 2 to 10 and Comparative Examples 1 to 4 was applied onto a release-treated film in the same way as described above, and the solution was dried at 130° C. for 2 minutes to produce an adhesive sheet having a thickness of 20 μm. Then, the solution was thermally cured at 175° C. for 5 hours, and left at 260° C. for 10 minutes. Each adhesive sheet (thickness 20 μam) was cut out into a size of 240 mm×300 mm (about 2.5 g), and was folded in half 5 times to a size of 37.5 mm×60 mm. Then, the sheet was placed in a tightly closed cylindrical Teflon (tradename) container having a diameter of 58 mm and a height of 37 mm, and 50 ml of a 10 ppm aqueous copper (II) ion solution was added in the container. Then, the container was left in an isothermal dryer (PV-231 manufactured by ESPEC Corp.) of 120° C. for 20 hours. The film was taken out to measure the concentration of copper ions in the aqueous solution using ICP-AES (SPS-1700HVR manufactured by SII Nano Technology Inc.). The results are shown in Tables 2 and 3.
(Measurement of Shear Adhering Strength at 175° C.)

The adhesive composition solution according to Example 1 was applied onto a release-treated film consisting of a polyethylene terephthalate film having a thickness of 50 having been subjected to a silicone release treatment and the solution was dried at 130° C. for 2 minutes to produce an adhesive sheet having a thickness of 20 μm. A mirror wafer (manufactured by Tokyo Kakoh Corporation) having a thickness of 760 μm was ground to a thickness of 500 μm using a grinder (DGP8760 manufactured by DISCO Corporation). At this time, GF01-SD320-BT300-50 manufactured by DISCO Corporation was used for a Z1 wheel and IF-01-1-4/6-B-K09 manufactured by DISCO Corporation was used for a Z2 wheel. The produced adhesive sheet was pasted to the ground surface of the wafer having a thickness of 500 μm 60° C., and dicing was performed to produce a chip of 5 mm×5 mm on which the adhesive sheet was pasted. No cracks or chipping were generated in the mirror wafer when the adhesive sheet was pasted onto the mirror wafer. The wafer having a thickness of 500 μm that had been ground under the same conditions as described above was diced to produce a chip of 10 mm×10 mm. The produced chip with an adhesive sheet was die-bonded to the ground surface of the 10 mm×10 mm chip under conditions of 120° C., 0.25 kg, and 1 s, and cured by heating at 175° C. for 1 hour. The shear adhering strength of the adhesive sheet and the chip was measured using a shear tester (Dage 4000 manufactured by Dage Holdings Limited). The conditions of the shear test were a measurement speed of 500 μm/s, a measurement gap of 100 μm, and a stage temperature of 175° C. Each of the adhesive composition solutions according to Examples 2 to 10 and Comparative Examples 1 to 4 was applied onto a release-treated film in the same way as described above, and the solution was dried at 130° C. for 2 minutes to produce an adhesive sheet having a thickness of 20 μm. The same test as in Example 1 was performed on each of the adhesive sheets. The results are shown in Tables 2 and 3.

(Results)

As can be understood from the results in Tables 1 to 3, an adhesive sheet formed from an adhesive composition containing an organic complex-forming compound having a 5% weight loss temperature measured by thermogravimetry of 180° C. or more has high cation scavengeability both before and after thermal curing.

What is claimed is:

1. An adhesive composition for producing a semiconductor device comprising at least an organic complex-forming compound that forms a complex with cations, wherein
   the 5% weight loss temperature of the organic complex-forming compound measured by thermogravimetry is 180° C. or more.

2. The adhesive composition according to claim 1, wherein the organic complex-forming compound is soluble in an organic solvent.

3. The adhesive composition according to claim 1, wherein the organic complex-forming compound is one or more compound(s) selected from the group consisting of a nitrogen-containing compound, a hydroxyl group-containing compound, and a carboxyl group-containing compound.

4. The adhesive composition according to claim 3, wherein the nitrogen-containing compound is one or more compound(s) selected from the group consisting of a triazole compound, a tetrazole compound, a pyridyl compound and a triazine compound.

TABLE 2

|  | Example 1 | Example 2 | Example 3 | Example 4 | Example 5 | Example 6 | Example 7 |
| --- | --- | --- | --- | --- | --- | --- | --- |
| Concentration (ppm) of copper (II) ions before thermal curing | 9.8 | 9.6 | 8.95 | 7.74 | 0.12 | 3.5 | 8.66 |
| Concentration (ppm) of copper (II) ions after thermal curing | 9.9 | 9.9 | 9.9 | 9.8 | 8 | 8.3 | 9.5 |
| Shear adhering strength (MPa) at 175° C. | 3.5 | 4 | 5 | 23.5 | 16.5 | 1 | 3 |

TABLE 3

|  | Example 8 | Example 9 | Example 10 | Comparative Example 1 | Comparative Example 2 | Comparative Example 3 | Comparative Example 4 |
| --- | --- | --- | --- | --- | --- | --- | --- |
| Concentration (ppm) of copper (II) ions before thermal curing | 7.97 | 7 | 2.56 | 10 | 10 | 9.6 | 9.9 |
| Concentration (ppm) of copper (II) ions after thermal curing | 9 | 8.52 | 5 | 10 | 10 | 10 | 10 |
| Shear adhering strength (MPa) at 175° C. | 3.5 | 1 | 0.3 | 0.8 | 1.5 | 0.01 | 3.5 |

5. The adhesive composition according to claim 3, wherein the hydroxyl group-containing compound is one or more compound(s) selected from the group consisting of a quinol compound, a hydroxyanthraquinone compound, a polyphenol compound, and a higher alcohol.

6. The adhesive composition according to claim 3, wherein the carboxyl group-containing compound is one or more compound(s) selected from the group consisting of a carboxyl group-containing aromatic compound and a carboxyl-containing aliphatic compound.

7. The adhesive composition according to claim 1, wherein the content of the organic complex-forming compound is in a range of 0.2 to 20 parts by weight to 100 parts by weight of the adhesive composition.

8. The adhesive composition according to claim 1, wherein an epoxy resin is contained.

9. An adhesive sheet for producing a semiconductor device that is formed from the adhesive composition according to claim 1.

10. The adhesive sheet according to claim 9, wherein when 2.5 g of the adhesive sheet is soaked in 50 ml of an aqueous solution containing 10 ppm of copper ions, and the solution is left at 120° C. for 20 hours, the concentration of copper ions in the aqueous solution is 0 to 9.9 ppm.

11. The adhesive sheet according to claim 9, wherein the shear adhering strength of the adhesive sheet to an adherend at 175° C. after the adhesive sheet has been cured by heating at 175° C. for 1 hour is 0.01 MPa or more and 100 MPa or less.

12. The adhesive sheet according to claim 9, wherein the tensile storage modulus at 60° C. before the sheet is thermally cured is 0.01 MPa or more and 1000 MPa or less.

13. The adhesive composition according to claim 1, wherein the adhesive composition contains epoxy resin, phenolic resin and acrylic resin, and the total amount of the combined epoxy resin and the phenolic resin is from 10 to 2000 parts by weight relative to 100 parts by weight of the acrylic resin.

14. A method of manufacturing a semiconductor device comprising adding cation to a semiconductor device in the presence of the adhesive sheet of claim 9, whereby the adhesive sheet captures said cation, and deterioration of the electrical property of the circuit-forming area of the semiconductor device is restrained.

* * * * *

UNITED STATES PATENT AND TRADEMARK OFFICE
CERTIFICATE OF CORRECTION

| | | |
|---|---|---|
| PATENT NO. | : 8,659,157 B2 | Page 1 of 1 |
| APPLICATION NO. | : 13/477349 | |
| DATED | : February 25, 2014 | |
| INVENTOR(S) | : Kimura et al. | |

It is certified that error appears in the above-identified patent and that said Letters Patent is hereby corrected as shown below:

In the Specification

In column 1 at line 66, Change "anion" to --an ion--.

In column 3 at lines 26-27, Change "compound (s)" to --compound(s)--.

In column 3 at lines 32-33, Change "compound (s)" to --compound(s)--.

In column 5 at line 4, Change "compound (s)" to --compound(s)--.

In column 5 at lines 29-30, Change "dicarobxydiethyl" to --dicarboxydiethyl--.

In column 5 at lines 63-66, Change "EVESORB 81, EVESORB 109, EVESORB 70, EVESORB 71, EVESORB 72, EVESORB 73, EVESORB 74, EVESORB 75, EVESORB 76, EVESORB 78, and EVESORB 80." to --EVERSORB 81, EVERSORB 109, EVERSORB 70, EVERSORB 71, EVERSORB 72, EVERSORB 73, EVERSORB 74, EVERSORB 75, EVERSORB 76, EVERSORB 78, and EVERSORB 80.--.

In column 7 at line 11, Change "tetraphenylol" to --tetraphenol--.

In column 7 at line 13, Change "trisglycidylisocyanurate" to --triglycidylisocyanurate--.

In column 7 at line 17, Change "tetraphenylol" to --tetraphenol--.

In column 14 at line 58, Change "50" to --50 μm--.

Signed and Sealed this
Thirtieth Day of September, 2014

Michelle K. Lee
*Deputy Director of the United States Patent and Trademark Office*